United States Patent [19]

Lewis

[11] Patent Number: 5,043,606

[45] Date of Patent: Aug. 27, 1991

[54] APPARATUS AND METHOD FOR PROGRAMMABLY CONTROLLING THE POLARITY OF AN I/O SIGNAL OF A MAGNETIC DISK DRIVE

[75] Inventor: David M. Lewis, Santa Cruz, Calif.

[73] Assignee: Seagate Technology, Inc., Scotts Valley, Calif.

[21] Appl. No.: 502,568

[22] Filed: Mar. 30, 1990

[51] Int. Cl.[5] .......... H03K 19/177

[52] U.S. Cl. .......... 307/475; 307/465; 307/270; 307/471

[58] Field of Search .......... 307/465, 475, 270, 471

[56] References Cited

U.S. PATENT DOCUMENTS

| | | | |
|---|---|---|---|
| 4,677,318 | 6/1987 | Veenstra | 307/465 |
| 4,680,491 | 7/1987 | Tokouchi et al. | 307/452 |
| 4,761,570 | 8/1988 | Williams | 307/465 |

*Primary Examiner*—Stanley D. Miller
*Assistant Examiner*—Scott A. Ouellette
*Attorney, Agent, or Firm*—Flehr, Hohbach, Test, Albritton & Herbert

[57] ABSTRACT

A programmable register stores a control bit for settting the logic polarity of an I/O signal at an I/O terminal of an integrated circuit. The I/O polarity control signal is combined in an exclusive-OR logic circuit with the I/O signal to provide a given logic polarity for the I/O signal. For a bi-directional I/O terminal, two exclusive-OR gates are used, one for controlling polarity of output signals from the integrated circuit to the I/O terminal and the other for controlling the polarity of input signals to the integrated circuits which are received at the I/O terminal. The control of the I/O signal polarity is particularly useful for a disk-drive controller which interfaces with different magnetic disk drive units, having different I/O signal polarity requirements.

10 Claims, 1 Drawing Sheet

APPARATUS AND METHOD FOR PROGRAMMABLY CONTROLLING THE POLARITY OF AN I/O SIGNAL OF A MAGNETIC DISK DRIVE

BACKGROUND OF THE INVENTION

1. Field of the Invention

This invention relates to input/output I/O circuits and, more particularly, to I/O signals having programmably controlled polarities.

2. Prior Art

The polarity of a bipolar I/O logic signal is described as the signal level at which the signal is defined to be true. A positive-true signal polarity is one in which a positive signal level represents a true condition, while a zero signal level or a negative signal level represents a false condition. I/O signals are commonly associated with computer or controller systems and the polarity of an I/O signal present in a particular computer or controller system at a particular terminal or integrated-circuit pin is defined to have a predetermined polarity. Previously, a programmer writing computer software for the computer or controller system would need to know and to keep track of whatever polarity had been assigned to a particular I/O terminal or pin. Alternatively, additional inverter circuits are provided as needed as part of the peripheral, or glue logic, circuits which tie operation of the various components of a system together. Keeping track of the polarity of various I/O signals in inconvenient and a source of programming error. Using inverter circuits, particularly at the high current levels associated with I/O signals takes additional circuit space and consumes additional power.

A single-chip controller for use with a variety of different magnetic disk drive models must accommodate a number of different I/O polarities. Solutions in the past have, as described hereinabove, relied upon software tracking and/or use of additional inverter circuits as required.

A circuit for generating an output signal having a selected output polarity is disclosed in the Sievers et al. U.S. Pat. No. 4,670,714, granted June 2, 1987 and titled "Programmable Output Polarity Device." A polarity of an output signal is set by blowing a field programmable fuse. A separate active-high selection line and a separate active-low selection line are provided; each of these selection lines can override the field programmable fuse for test purposes.

For certain I/O terminals of certain integrated circuits, the polarity of those I/O terminals needs to be variable to accommodate particular applications. It is desirable that storage be provided for selective programming and reprogramming the polarity of an I/O terminal.

SUMMARY OF THE INVENTION

It is therefore an object of the invention to provide a system for keeping track of the polarity of an I/O signal which eliminates the need for external inverters and which allows a programmer to handle all I/O signals as if each of them had, for example, positive polarity.

In accordance with this and other objects of the invention, a programmable circuit for setting the logic polarity of an I/O signal at an I/O terminal of an integrated circuit is provided. The integrated circuit is, for example, a controller for a magnetic disk drive. The circuit includes a programmable storage means, for example, a register, which is controllable by an input signal from a control source, such as a microprocessor. The storage means or register provides an I/O polarity control signal. This control signal is combined in an exclusive-OR logic circuit with an I/O signal to provide a predetermined logic polarity for the I/O signal. When the I/O terminal is bi-directional, the exclusive-OR logic circuit includes two exclusive-OR gates. A first exclusive-OR gate has one terminal connected to receive the I/O polarity control signal from the storage register. The other terminal is coupled to an internal output signal of the integrated circuit. The output terminal of this first exclusive-OR gate is coupled to the I/O terminal of the integrated circuit. The second exclusive-OR gate has one input terminal coupled to the storage register for receiving the I/O polarity control signal. The other input terminal of the second exclusive-OR gate is coupled to the I/O terminal of the integrated circuit. The output terminal of the second exclusive-OR gate is coupled to an internal input terminal of the integrated circuit.

According to one aspect of the invention, the output terminal of the first exclusive-OR gate is coupled through a tri-state buffer to the I/O terminal of the integrated circuit. The second input terminal of the second exclusive-OR gate is coupled through a standard input buffer to the I/O terminal of the integrated circuit. These buffers provide appropriate isolation for the signals.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

This invention is useful in a single-chip magnetic disk drive controller which provides an interface between a magnetic disk drive unit and a user bus system, such as for example, the SCSI bus defined by an ANSI specification. The signal polarities of the various signals at the controller's interface with the disk drive unit vary, depending upon the manufacturer and model of the disk drive unit. A programmable polarity feature permits a disk controller to interface with almost any disk drive unit without the necessity to use an additional interface circuit to obtain the correct signal polarities at the controller disk drive interface.

Figure 1:
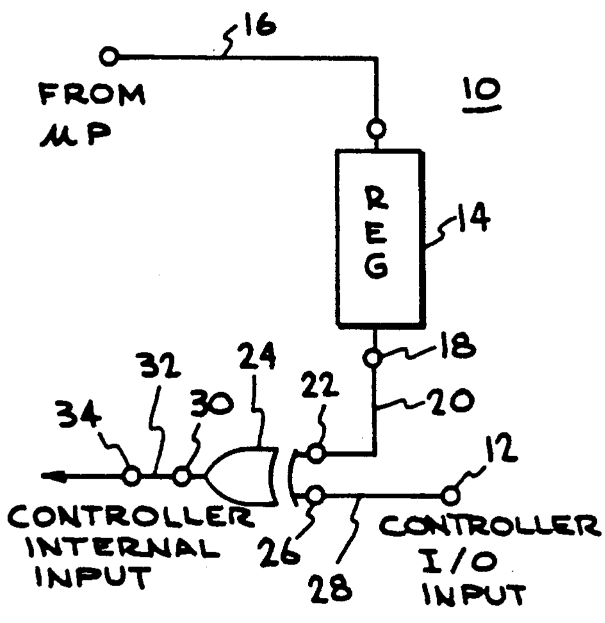
FIG. 1 is a circuit diagram of a circuit for programming the logic polarity of an input I/O signal received at an I/O terminal of an integrated circuit.

FIG. 1 is a circuit diagram of a circuit 10 for programming the logic-signal polarity of an input I/O signal received at an I/O terminal 12 of an integrated circuit, such as a controller for a magnetic disk drive unit (not shown) having an electrical interface with predetermined signal polarities. By signal polarity is meant the electrical signal level which is defined as true. A register 14 receives and stores a control bit on a signal line 16. The signal line 16 is from a microprocessor or other control circuits associated with. The register 14 provides a programmable storage function and provides at an output terminal 18 an I/O polarity control signal to a signal line 20. The signal line 20 is connected to a first input terminal 22 of an exclusive OR gate 24. The other input terminal 26 of the exclusive OR 24 is connected through a signal line 28 to the I/O input terminal 12. The output terminal 30 of the exclusive OR gate 24 is connected to a signal line 32 to a terminal 34, which is an internal terminal point within, for example, a controller integrated circuit. The terminal 34 receives input signals and couples them to the circuitry of the controller or other integrated circuit.

Depending on the polarity of the I/O polarity control signal at terminal 18 of the register 14, the exclusive OR gate 24 will either invert or not invert the I/O input signal at terminal 12 as it passes through the exclusive OR gate 24. If terminal 18 is at a one level, the exclusive OR gate 24 inverts the I/O input signal and if the signal at terminal 18 is at a zero level, the exclusive OR gate 24 does not invert the I/O input signal. Whether the I/O input signal is to be inverted or not inverted is controlled from the microprocessor or other control source on the signal line 16.

Figure 2:
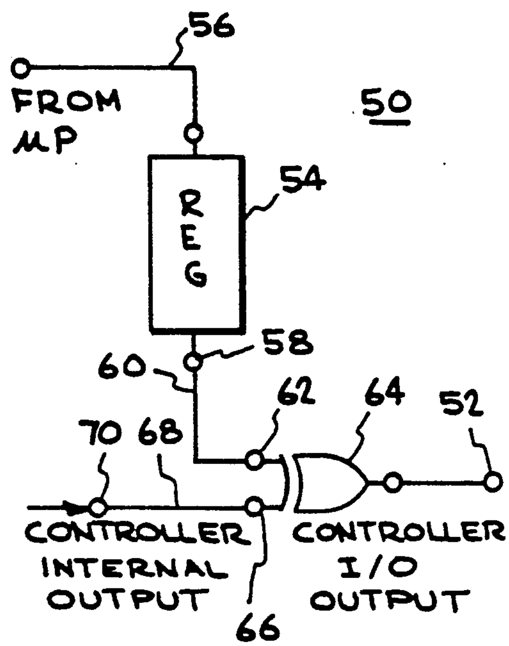
FIG. 2 is a circuit diagram of a circuit for programming the logic polarity of an output I/O signal transmitted at an I/O terminal of an integrated circuit.

FIG. 2 is a circuit diagram of a circuit 50 for programming the logic polarity of an output I/O signal transmitted from an I/O terminal 52 of, for example, an integrated circuit. A register 54 is used for storing a bit representing an I/O polarity control signal received at an input terminal on a signal line 56 from a microprocessor or other control source. The output terminal 58 of the register 54 is connected through a signal line 62 and input terminal 62 of a second exclusive OR 64. Another input terminal 66 of the exclusive OR 64 is connected through a signal line 68 to an internal terminal 70 of the integrated circuit controller, to which is connected an internal signal to be outputted through the I/O output terminal 52 of the controller. The polarity of the output signal at terminal 52 is determined by the state of the control bit stored in the register 54. A one bit will invert the internal output signal at terminal 70 as that signal appears at the output terminal 52. A zero control bit provides a non-inverted I/O output signal at terminal 52.

Figure 3:
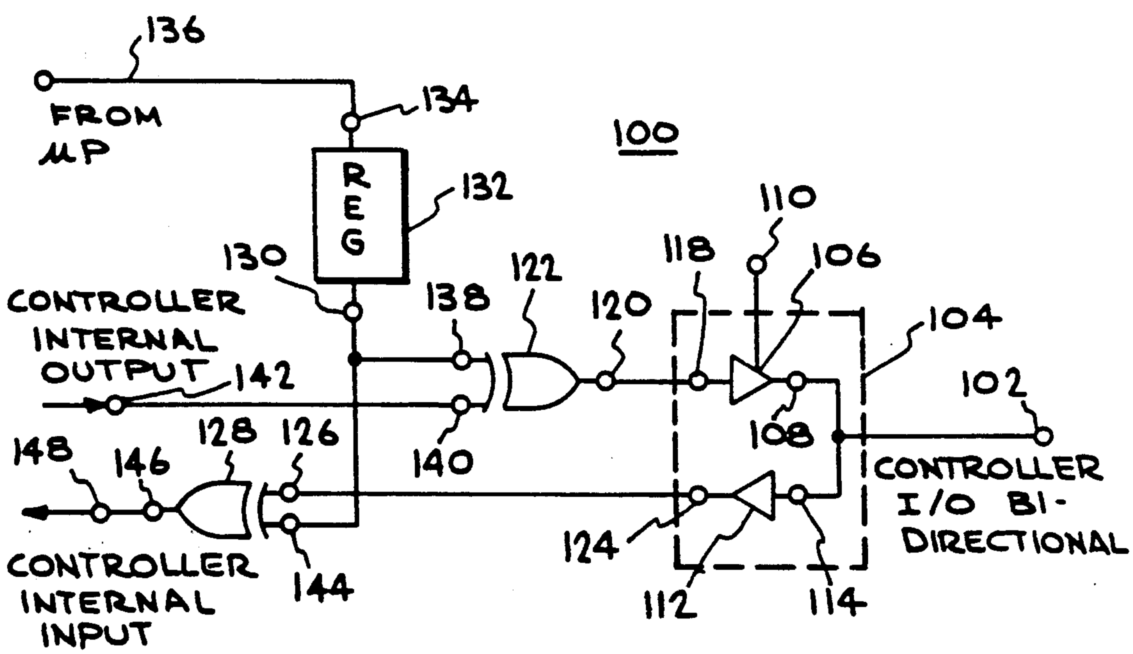
FIG. 3 is a circuit diagram of a circuit for programming the logic polarity of both an input I/O signal and an output I/O signal at an I/O terminal of an integrated circuit.

FIG. 3 shows a programmable logic-polarity circuit for setting the logic polarity of an I/O signal at a terminal 102. The signal at terminal 102 of the controller can be either an input or an output signal. For this type of bi-directional terminal a bi-directional I/O pad 104, is indicated by the dotted line, is provided. Located within the pad 104 is a tri-state buffer 106 which has its output terminal 108 connected to the bi-directional I/O terminal 102. A control terminal 110 for the tri-state buffer 106 is connected to an appropriate control signal such as a write-gate signal for inputting data to a magnetic disc drive system. Input buffer 112 has its input terminal 114 connected to the bi-directional I/O terminal 102.

The tri-state buffer 106 has its input terminal 118 connected to the output terminal 120 of an output exclusive-OR gate 122. The output terminal 124 of the input buffer 112 is coupled to an input terminal 126 of a second exclusive OR gate 128. The tri-state buffer 106 isolates the bi-directional I/O terminal 102 from output signals from the first exclusive-OR gate 122, as controlled by an appropriate control signal at terminal 110. The input buffer 112 isolates the second exclusive OR gate 128 from signals appearing at the bi-directional I/O terminal 102.

The polarity of the signals passing through the first exclusive-OR gate 122 and the second exclusive-OR gate 128 are controlled by an I/O polarity control signal appearing at the output terminal 130 of a storage register 132. The storage register 132 has an input terminal 134 which is connected by a signal line 136 to a microprocessor control microprocessor or other control source for determining the polarity of the signals passed through the exclusive-OR gates 122 or 128. The output terminal 130 of the register 132 is connected to a first input terminal 138 of the first exclusive-OR gate 122. The other terminal 140 of the exclusive-OR gate 122 is connected to an internal terminal 142 of, for example, an integrated circuit controller. The exclusive-OR gate 122 thus passes the signals appearing at the internal output terminal 140 to the bi-directional I/O terminal 102. The polarity of the signal at the bi-directional I/O terminal 102 is controlled by the I/O polarity control signal at terminal 130. The presence of the signal output from the exclusive-OR gate 122 is controlled by the tri-state control system at terminal 110.

The I/O polarity control signal at terminal 130 of the register 132 is also connected to an input terminal 144 of the second exclusive-OR gate 128. Input signals from the bi-directional I/O terminal 102 are passed through the in-state buffer 112 under control of a control signal at terminal 126 to the output terminal 146 of the exclusive-OR gate 128. The output terminal 146 of the exclusive-OR gate 128 is connected to an internal input terminal 148 for the integrated circuit controller. Signals from the bi-directional I/O terminal 102 are thus set to a predetermined polarity as provided by the control bit stored in the register 132.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A programmable logic-polarity circuit for setting the logic polarity for an I/O signal at an I/O terminal of an integrated-circuit controller adapted to interface with various magnetic disk drive units having different I/O signal polarity requirements, comprising:

programmable storage means for receiving an I/O polarity-control signal and for providing said I/O polarity control signal at an output terminal thereof;

exclusive-OR logic means, having an input terminal coupled to the output terminal of said programmable storage means and having another input terminal for receiving said I/O signal, responsive to said I/O polarity control signal, for exclusive-ORing said I/O polarity control signal with said I/O signal to provide said I/O signal of said controller for a magnetic disk drive unit with a predetermined logic polarity for said I/O signal.

2. The circuit of claim 1 wherein the programmable storage means includes a register, the contents of which are controllable by an input signal from a control source, the contents of the register providing the polarity control signal.

3. The circuit of claim 1 wherein said exclusive-OR logic means includes:

a first exclusive-OR gate having a first input terminal coupled to said output terminal of said programmable storage means, having a second input terminal coupled to an internal output terminal of said integrated circuit, and having an output terminal coupled to said I/O terminal of said controller;

a second exclusive-OR gate having a first input terminal coupled to said output terminal of said programmable storage means, having a second input terminal coupled to said I/O terminal of said controller, and having an output terminal coupled to an internal input terminal of said integrated controller.

4. The circuit of claim 3 wherein the output terminal of said first exclusive-OR gate is coupled to said input-/output terminal of said integrated circuit through a tri-state buffer circuit; and the second input terminal of said second exclusive-OR gate is coupled to said input/output terminal of said integrated circuit through a buffer circuit.

5. A programmable logic-polarity circuit for setting the logic polarity for an I/O signal at an input/output terminal of an integrated circuit, comprising:

programmable storage means for providing an I/O polarity control signal at an output terminal thereof;

exclusive-OR logic means, responsive to said I/O polarity control signal, for exclusive-ORing said I/O polarity control signal with said I/O signal to provide a predetermined logic polarity for said I/O signal.

6. The circuit of claim 1 wherein the programmable storage means includes a register, the contents of which are controllable by an input signal from a control source, the contents of the register providing the polarity control signal.

7. The circuit of claim 1 wherein said exclusive-OR logic means includes:

a first exclusive-OR gate having a first input terminal coupled to said output terminal of said programmable storage means, having a second input terminal coupled to an internal output terminal of said integrated circuit, and having an output terminal coupled to said input/output terminal of said integrated circuit;

a second exclusive-OR gate having a first input terminal coupled to said output terminal of said programmable storage means, having a second input terminal coupled to said input/output terminal of said integrated circuit, and having an output terminal coupled to an internal input terminal of said integrated circuit.

8. The circuit of claim 7 wherein the output terminal of said first exclusive-OR gate is coupled to said input-/output terminal of said integrated circuit through a tri-state buffer circuit; and the second input terminal of said second exclusive-OR gate is coupled to said input/output terminal of said integrated circuit through a buffer circuit.

9. A method of programming the polarity of an I/O signal received and transmitted at the polarity of an output terminal of a controller for a magnetic disk drive unit with a predetermined logic polarity, comprising the steps of:

providing a control bit indicative of the logic-polarity desired;

storing said control bit in a register;

exclusive-ORing said control bit and said signal to provide the I/O signal with said predetermined logic polarity.

10. A method of programming an input/output signal received and transmitted at an output terminal of an integrated circuit with a predetermined logic polarity, comprising the steps of:

providing a control bit indicative of the logic-polarity desired;

exclusive-ORing said control bit and said signal to provide the input/output signal with said predetermined logic polarity.

* * * * *